SHAFT ENCODER

Filed Jan. 17, 1966

INVENTORS
RAYMOND H. DEVANNEY
SYLVESTER W. BIES
BY
Lindsey, Prutzman and Hayes
ATTORNEYS INVENTORS
RAYMOND H. DEVANNEY
SYLVESTER W. BIES
BY
Lindsey, Prutzman and Hayes
ATTORNEYS

United States Patent Office 3,423,750
Patented Jan. 21, 1969

3,423,750

SHAFT ENCODER

Raymond H. Devanney, Winsted, and Sylvester W. Bies, Bloomfield, Conn., assignors to Veeder Industries Inc., a corporation of Connecticut Filed Jan. 17, 1966, Ser. No. 535,260
U.S. Cl. 340—347 2 Claims
Int. Cl. H04l 3/00

ABSTRACT OF THE DISCLOSURE

A binary coded readout device using three rotary contacts to apply potential to four conductors arranged in the circular paths of said contacts. Each conductor is arranged to be in the path of at least one contact in arc segments where that conductor should be energized and to be out of the path of all contacts where it should not be energized.

This invention relates generally to a binary coded readout device for use with a single wheel decade counter and, more particularly, to an improved shaft encoder which provides a binary coded decimal electrical readout of the angular position of the number wheel in an electromagnetic decade counter. The use of several such readout devices in a decade counter could provide a binary coded decimal (BCD) readout for a plural digit number applied to the input of the device.

The broad object of the invention is to provide an improved printed circuit pattern for use in conjunction with a rotating conductive brush to provide a binary coded electrical readout of the angular position of the brush.

Another object of the invention is to provide such a printed circuit pattern particularly designed for use with a single wheel electromagnetic counter.

A more specific object of the invention is to provide an improved printed circuit pattern designed to cooperate with a rotating conductive brush assembly having four contacts which wipe different paths on the circuit pattern to provide a binary coded electrical readout of the angular position of the brush assembly.

Another object of the invention is to provide an improved shaft encoder having an improved rotating brush assembly cooperating with an improved printed circuit pattern arranged to produce a binary coded readout of the angular position of the shaft.

Another object of the invention is to provide a shaft encoder which drives a plurality of brushes disposed relative to an improved printed circuit pattern having binary weights assigned to segments thereof such that the number of brushes required to produce a binary coded readout is only one more than the maximum number of weights used for a particular binary code.

Other objects will be in part obvious and in part pointed out more in detail hereinafter.

The invention accordingly consists in the features of construction, combination of elements and arrangement of parts which will be exemplified in the construction hereafter set forth and the scope of the application which will be indicated in the appended claims.

Figure 1:
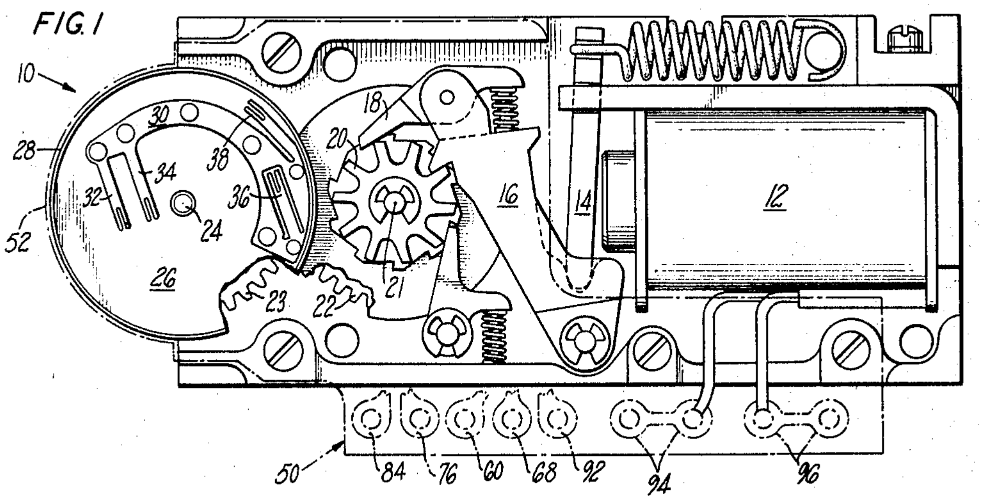
FIGURE 1 is a partially cut away side view of an electromagnetic single wheel counter module with which the improved printed circuit pattern may be used to provide a binary coded electrical readout of the position of the number wheel of the counter module.

In FIGURE 1 there is illustrated a single wheel electromagnetic decade counter module 10. The basic components of such a counter are a solenoid 12, its armature 14, a lever arm 16 actuated by the armature, a pawl 18 coupled to the lever arm, and a ratchet 20 stepped by the pawl and fixed to a shaft 21. Also fixed to shaft 21 is a gear 22 which meshes with a gear 23 fixed to another shaft 24. A number wheel 26 is also fixed to shaft 24. The ten decimal numerals "0," "1" . . . "8," "9" are equally spaced about the face 28 of number wheel 26. Each time solenoid 12 is energized, pawl 18 causes ratchet 20 and shaft 21 to rotate one ratchet step in counterclockwise direction. Gears 22 and 23 function to drive shaft 24 and number wheel 26 one step in the clockwise direction. Consequently, the decimal numerals on the faces 28 of number wheel 26 are moved past a given point in 36° steps.

Figures 2, 4:
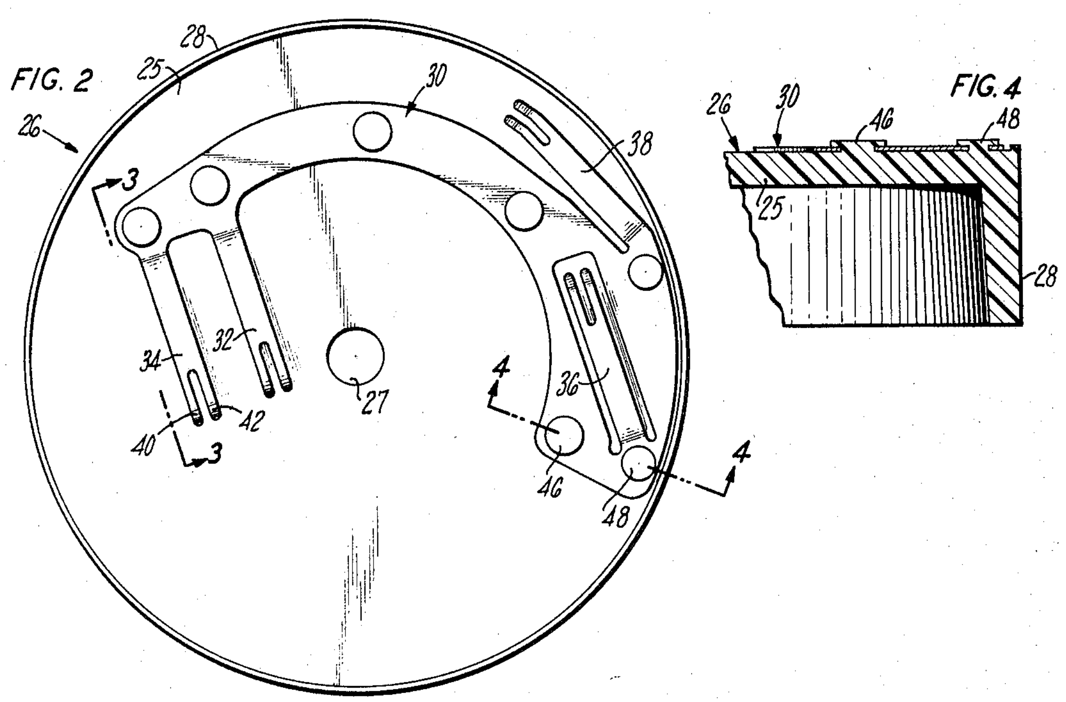
FIGURE 2 is an enlarged view of the improved brush assembly mounted on the number wheel of the counter module.
FIGURE 4 is an enlarged cross-sectional view taken along lines 4—4 of FIGURE 2.
Figure 3:
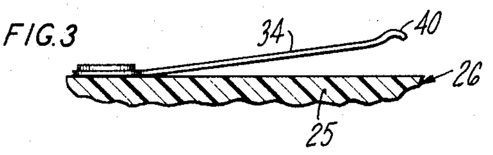
FIGURE 3 is an enlarged cross-sectional view taken along lines 3—3 of FIGURE 2.

Fixed to number wheel 26 is a conductive brush assembly 30 in the form of a flat arcuate metal plate having four integral brush contacts 32, 34, 36 and 38. FIGURES 2, 3 and 4 illustrate in greater detail brush assembly 30. Each brush contact is bent out of the plane of the paper and has two prongs formed in the end thereof. Contact 34, for example, has two prongs 40 and 42 which form the actual contact or wiping surfaces of the brush contact. The wheel 26 comprises a disc portion 25 having a center hole 27, and the face 28 extends around the disc portion. Disc portion 25 has integral studs, such as 46 and 48, which project through corresponding openings in brush assembly 30. These studs may be then subjected to a spinning or heat sealing process to secure brush assembly 30 to number wheel 26. The center hole 27 receives the number wheel drive shaft 24.

The four brush contacts 32, 34, 36 and 38 are arranged on assembly 30 such that their wiping surfaces are spaced at different radial distances from the center hole 27, thereby permitting each brush contact to coincide with a different one of the circular paths of the printed circuit pattern which will be described below in connection with FIGURE 5. Furthermore, the four brush contacts are located on assembly 30 in such a manner that none of the contacts overlaps another. In addition, the shape of the arcuate plate and the arrangement of the brush contacts provides a balanced brush assembly.

Of course, brush assembly 30 may also take the form of an arcuate plate and four separate brush contacts which are suitably secured to the plate.

Figure 5:
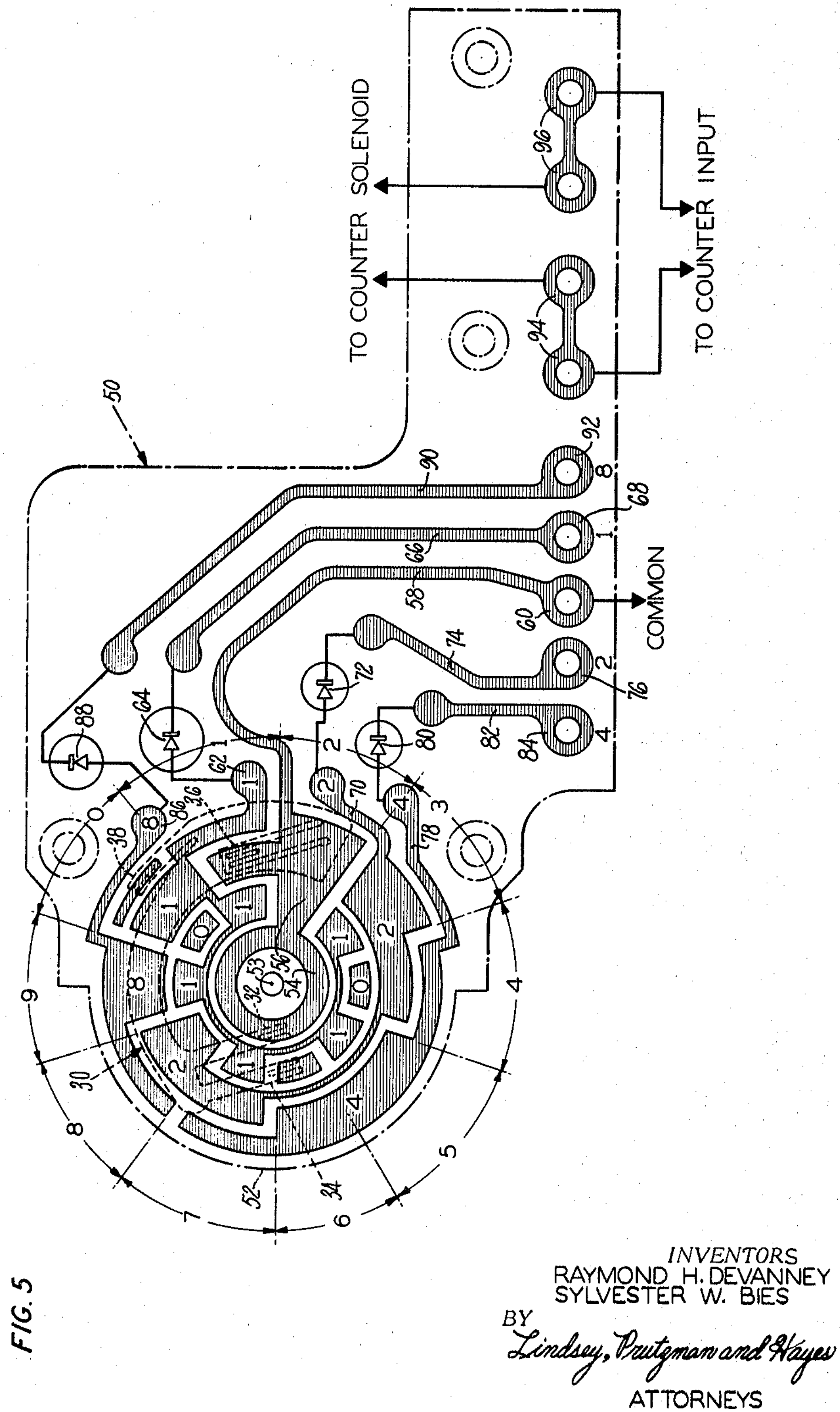
FIGURE 5 is an enlarged view illustrating the improved printed circuit pattern printed on a circuit board (shown in broken lines) for use with the improved brush assembly.

FIGURE 5 illustrates a printed circuit board 50 designed for insertion in counter module 10 to cooperate with brush assembly 30 to provide a binary coded electrical readout of the angular position of number wheel 26. The circuit board 50 has a plurality of conductive segments arranged in general circular paths on the curved end 52 thereof. When used in counter module 10, board 50 is placed against the side of the module as illustrated by dashed lines in FIGURE 1 so that the center point 53 of the circuit pattern is aligned with the axis of shift 24 and hole 27 and the brush contacts 32, 34, 36 and 38 engage the four circular paths of the printed circuit pattern as will be described below. The view of the printed circuit board shown in FIGURE 5 is through the back of the circuit board when in position on counter module 10 as seen in the view of FIGURE 1 with brush assembly 30 behind the board as shown in dotted lines.

The printed circuit pattern formed on the end 52 of circuit board 50 consists of five printed conductors arranged in four circular paths for cooperation with the four brush contacts of brush assembly 30. The circuit pattern may be considered to be divided into ten equal sectors of 36° each to correspond with the angular movement of number wheel 26 for each step of ratchet 20. These sectors are labeled in FIGURE 5 with the ten decimal numerals "0," "1" . . . "8," "9" to correspond to the ten positions of number wheel 26 and thereby to the ten positions of brush assembly 30 on the printed circuit pattern. It is assumed that brush contact 38 is aligned with the "0" position of number wheel 26. Consequently, the sector in which brush 38 appears for any position of brush assembly 30 identifies the decimal readout position of number wheel 26.

Let us now look at the printed circuit pattern in more detail. First, it will be noted that the pattern is generally formed in four concentric circular paths with the radius of each path coinciding with the radial distance from the axis of hole 27 of a different one of the contact brushes of brush assembly 30. In the innermost circular path, there is formed a continuous printed conductor 54 which shall be identified as the COMMON or POWER conductor since it includes an integral wedge-shaped segment 56 which extends across the three outer circular paths in sector "2" and is connected via a printed circuit lead 58 to a printed terminal 60 to which a suitable electrical power supply may be connected to provide a binary coded electrical readout.

A printed conductor 62 is assigned a weight of "1" in the binary coded number system and has several integral segments in the three outer concentric circular paths surrounding the circular COMMON conductor 54. More specifically (considering only the three outer circular paths of the circuit pattern, i.e., excluding the path of conductor 54), conductor 62 has integral segments in the outer path of sector "1," in the middle path in sector "0," and in the inner path of sectors "1," "9," "7," "5" and "3." Furthermore, conductor 62 is connected via a printed semiconductor diode 64 and a printed lead 66 to a printed binary coded "1" output terminal 68.

Another printed conductor 70 is assigned the weight of "2" in the binary coded system and has an integral segment covering the outer and center circular paths in sector "3," another integral segment in the center path of sector "4," another in the center path of sector "7," and another covering both the inner and center paths of sector "8." Conductor 70 is also connected via a printed semiconductor diode 72 and a printed lead 74 to a printed binary coded "2" output terminal 76.

A printed conductor 78 is assigned the weight of "4" in the binary coded system and has an integral segment in the outer circular path in sector "4," another segment covering both the outer and center paths of sectors "5" and "6," and still another integral segment in the outer circular path of sector "7." Conductor 78 is also connected via a printed semiconductor diode 80 and a printed lead 82 to a binary coded "4" output terminal 84.

A printed conductor 86 is assigned a weight of "8" in the binary coded system and has an integral segment covering the outer and center circular paths in sector "9" and another integral segment in the outer path of sector "8." Conductor 86 is connected via a printed semiconductor diode 88 and a printed lead 90 to a binary coded "8" output terminal 92.

Furthermore, open circuited or "0" conductive segments are printed in the outer path of sector "0" and in the inner paths of sectors "0," "4," and "6."

As previously mentioned, the four printed conductors 62, 70, 78 and 86 and their respective integral segments are arranged in three concentric paths to correspond with the locations of the brush contacts 34, 36 and 38 on brush assembly 30. More specifically, brush contact 38 engages or wipes along the conductor segments in the outer circular path of the printed circuit pattern, brush contact 36 the center circular path, and brush contact 34 the inner circular path. Moreover, the circular COMMON or POWER conductor 54 is located so that it is wiped continuously by the brush contact 32.

In operation, the rotating brush assembly 30 and the printed circuit pattern form a shaft encoder to convert the angular position of the brush assembly (and therefore, number wheel 26) to a binary coded readout at terminals 68, 76, 84 and 92. Power is applied via the COMMON terminal 60 to the inner circular COMMON conductor 54 via the brush contact 32 to any of the conductors 62, 70, 78 and 86 whose respective integral segments are engaged by any of the other brush contacts. The segments so engaged then complete a circuit between the COMMON terminal 60 and the output terminals 68, 76, 84 and 92 corresponding to the engaged segments, thereby providing voltage signals on those output terminals corresponding to the engaged segments.

More specifically, let us consider the position of brush assembly 30 shown in dotted lines in FIGURE 5. Contact 34 rests on a "0" segment in sector "6," contact 36 rests on the COMMON segment 56 in sector "1," and contact 38 rests on a "0" segment in sector "0." consequently, no voltage output signal appears on any of the binary coded output terminals 68, 76, 84 and 92, and such a condition represents a binary coded readout or output of "0" also corresponding to decimal output of "0."

Let us now assume that ratchet 20 causes the number wheel 26 to rotate one step in the clockwise direction. Counter wheel 26 and brush assembly 30 are now in a decimal "1" count position. Contact 34 now rests in sector "7" on a segment of the binary coded "1" conductor 62, contact 36 remains on the COMMON conductor segment 56 but now in sector "2," and contact 38 rests on a segment on the "1" conductor 62 in sector "1." Consequently, a circuit will be connected between the COMMON output terminal 60 and the binary coded "1" output terminal 68 via the COMMON conductor 54, brush assembly 30 and conductor 62 to provide a voltage signal on the "1" output terminal 68. No signal will appear on any of the other output terminals. Such a condition defines a binary coded output or readout of "1" corresponding to the decimal position "1" of number wheel 26.

The following truth table tabulates the positions of the three brush contacts 34, 36 and 38 relative to the four conductors 62, 70, 78 and 86 which are identified by their binary coded weights of "1," "2," "4" and "8," respectively. Column 1 of the table lists the ten decimal positions of counter wheel 26 and also identifies the ten equal sectors "0," "1" . . . "8," "9" indicated on the printed circuit pattern illustrated in FIGURE 5. Columns 2, 3 and 4 identify the weighted conductor segments engaged by each of the brush contacts 34, 36 and 38 in each of the ten sectors or decimal positions. Column 5 indicates in terms of the assigned weights which of the output terminals 68, 76, 84 and 92 carries an output voltage signal for each of the ten positions of brush assembly 30.

| Decimal count (counter position) (sector) (1) | Contacts (2) | (3) | (4) | Binary coded readout (5) |
|---|---|---|---|---|
| 0 | | | | 0 |
| 1 | 1 | | 1 | 1 |
| 2 | | 2 | 2 | 2 |
| 3 | 2 | 2 | 1 | 2+1 |
| 4 | 4 | 4 | | 4 |
| 5 | 4 | 4 | 1 | 4+1 |
| 6 | 4 | 2 | | 4+2 |
| 7 | 4 | 2 | 1 | 4+2+1 |
| 8 | 8 | 8 | | 8 |
| 9 | 8 | 1 | 1 | 8+1 |

Also printed on circuit board 50 are two pairs 94 and 96 of additional terminals for connecting counter solenoid 12 to a suitable counter input means which energizes the solenoid to step the counter.

The invention described above includes five important features:

(1) A unique printed circuit pattern for providing binary coded readout;

(2) A unique brush assembly for use with the printed circuit pattern which eliminates the need for crossover networks and provides an improved balanced brush location;

(3) An improved shaft encoder incorporating the circuit pattern and brush assembly to provide a binary coded readout of the angular position of a rotating shaft;

(4) A combination of a shaft encoder and a single wheel or decade counter module to provide a binary coded electrical readout of the position of the counter wheel; and (5) The number of brush contacts and the number of tracks required is one less than the actual number of binary coded weights used.

As will be apparent to persons skilled in the art, various modifications and adaptations of the structure above described will become readily apparent without departure from the spirit and scope of the invention, the scope of which is defined in the appended claims.

We claim:

1. An encoder for converting the angular position of a rotatable contact means to binary coded electrical readout signals comprising:

(a) rotatable conductive contact means having three contacts affixed thereto, each of said contacts being spaced a different distance from the center of rotation of said contact means and each of said contacts being laterally displaced from the other of said contacts, (b) means for maintaining each of said three contacts at substantially constant potential, (c) a fixed-position circuit board having four conductors on one side thereof immediately adjacent to said three contacts, said board being arranged to have three circular paths concentric about said center of rotation, each of said contacts being arranged to follow and engage the conductors in one of said three paths, (d) said conductors being arranged on said board so that each individual path of said three paths contains, in one arc of said individual path, a segment of a different one of said four conductors than is contained in at least one other arc of said individual path and so that each of said four conductors is contained in at least one of said three paths, (e) four output terminals, each of said four conductors being connected respectively to one of said four output terminals to provide a binary output of one type when engaged by any one of said three contacts and to provide a binary output of the other type when not engaged by any of said three contacts, and (f) said three contacts being electrically interconnected and four of said conductors being weighted in accordance with the one, two, four and eight positions, respectively, of the binary coded decimal number system and having integral portions in more than one of said paths so that the conductor portions engaged by said three contacts for the ten positions of the shaft are in accordance with the folowing truth table wherein the three contacts are identified as A, B and C, respectively:

| Shaft Position | Contacts | | | Binary Coded Output |
|---|---|---|---|---|
| | A | B | C | |
| 0 | | | | 0 |
| 1 | 1 | | 1 | 1 |
| 2 | 0 | 2 | 2 | 2 |
| 3 | 2 | 2 | 1 | 2+1 |
| 4 | 4 | 4 | | 4 |
| 5 | 4 | 4 | 1 | 4+1 |
| 6 | 4 | 2 | | 4+2 |
| 7 | 4 | 2 | 1 | 4+2+1 |
| 8 | 8 | 8 | | 8 |
| 9 | 8 | 1 | 1 | 8+1 |

2. A printed circuit board comprising:

(a) three circular paths concentric about some center point, said paths being termed the inner, middle and outer paths, each of said paths being divided into ten substantially equiangular arc sectors, said sectors being successively termed sectors 0, 1, 2, 3, 4, 5, 6, 7, 8 and 9, (b) four conductors so arranged on one side of said circuit board that each individual path of said three paths contains, in one sector of said individual path, a segment of a different one of said four conductors than is contained in at least one other of said individual paths and so that each of said four conductors is contained in at least one of said three paths, (c) an output terminal connected to each of said four conductors, and (d) said four conductors being respectively designated the 1, 2, 4 and 8 conductors, said paths in which said conductor segments appear are as shown in the following table:

| Sector | Inner | Paths middle | Outer |
|---|---|---|---|
| 0 | | 1 | |
| 1 | 1 | | 1 |
| 2 | | | |
| 3 | 1 | 2 | 2 |
| 4 | | 2 | 4 |
| 5 | 1 | 4 | 4 |
| 6 | | 4 | 4 |
| 7 | 1 | 2 | 4 |
| 8 | 2 | 2 | 8 |
| 9 | 1 | 8 | 8 |

References Cited

UNITED STATES PATENTS 2,127,733 8/1938 Herbst ---------- 235—92 X
2,822,130 2/1958 Nolde et al. ---------- 340—347 X
2,872,671 2/1959 Walton ---------- 340—347
2,873,442 2/1959 Ziserman ---------- 340—347
2,984,413 5/1961 Renshaw ---------- 235—92
3,048,669 8/1962 Mikkola et al. ---------- 340—347 X MAYNARD R. WILBUR, *Primary Examiner.*

G. EDWARDS, *Assistant Examiner.*